United States Patent
Rombach

(10) Patent No.: US 7,663,417 B2
(45) Date of Patent: Feb. 16, 2010

(54) PHASE-LOCKED LOOP CIRCUIT

(75) Inventor: Gerd Rombach, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 43 days.

(21) Appl. No.: 11/971,304

(22) Filed: Jan. 9, 2008

(65) Prior Publication Data
US 2008/0169850 A1 Jul. 17, 2008

(30) Foreign Application Priority Data
Jan. 12, 2007 (DE) .................. 10 2007 001 934

(51) Int. Cl.
*H03L 7/08* (2006.01)
(52) U.S. Cl. ..................... 327/156; 327/148
(58) Field of Classification Search ......... 327/147–150, 327/156–159
See application file for complete search history.

(56) References Cited

U.S. PATENT DOCUMENTS

| | | | |
|---|---|---|---|
| 5,847,614 A * | 12/1998 | Gilbert et al. ............... | 331/14 |
| 6,005,425 A * | 12/1999 | Cho ........................... | 327/156 |
| 6,215,361 B1 | 4/2001 | Lebouleux et al. | |
| 6,415,007 B1 * | 7/2002 | Kawasumi .................. | 375/374 |
| 6,661,294 B2 | 12/2003 | Terashima et al. | |
| 7,129,789 B2 | 10/2006 | Hsiao et al. | |
| 7,404,099 B2 * | 7/2008 | Huang et al. ................ | 713/500 |
| 7,412,617 B2 * | 8/2008 | Chang ........................ | 713/503 |

FOREIGN PATENT DOCUMENTS

| | | |
|---|---|---|
| DE | 101 54 993 | 3/2005 |
| EP | 0 828 350 | 3/1998 |

* cited by examiner

*Primary Examiner*—Hai L Nguyen
(74) *Attorney, Agent, or Firm*—John J. Patti; Wade J. Brady, III; Frederick J. Telecky, Jr.

(57) ABSTRACT

A phase-locked loop circuit comprises a phase frequency detector, a charge pump associated with a loop capacitance, and a voltage controlled oscillator. The phase frequency detector receives a reference clock signal on a first input and a feedback signal from the voltage controlled oscillator on a second input. The charge pump receives control inputs from outputs of the phase frequency detector. Pulse duration detecting circuitry limits charge and discharge current pulses supplied to the loop capacitance by the charge pump to durations less than predetermined permissible durations.

9 Claims, 2 Drawing Sheets

PHASE-LOCKED LOOP CIRCUIT

This application claims priority under 35 U.S.C. 119 from German Application No. 10 2007 001934.5 filed Jan. 12, 2007, the entirety of which is hereby incorporated herein by reference.

BACKGROUND

This relates generally to phase-locked loop (PLL) circuits; and, more particularly, to PLL circuits including phase frequency detectors and charge pumps.

In phase-locked loop (PLL) circuits, a time discrete phase frequency detector is widely used in combination with a charge pump. The phase frequency detector circuit generates the UP and DOWN signal for the charge pump. The charge pump delivers a constant source or sink current with a pulsewidth that depends upon the input signals. The width of the current pulse is equal to the phase offset of the UP and DOWN signal, which also reflects the phase offset of the reference clock and feedback clock signal. The pulsewidth is also the time duration to charge or discharge the PLL filter capacitor. When the PLL circuit has acquired lock, the current pulse duration is very small and only a little switching noise (at the PLL update frequency) is seen at the control voltage of the voltage controlled oscillator (VCO) in the PLL circuit.

The width of the current pulse is not limited by the circuit. If there is a very high jitter on the input clock, or if there are missing clock pulses, the phase offset never becomes very low. The same is true for fractional-N PLL circuits. There will never be a zero phase offset due to the principle of the fractional division in the PLL feedback path. A high phase offset is unlikely, which is the reason for noise on the VCO control voltage, and therefore the output jitter. Noise caused by the charge pump current pulse can be reduced by decreasing the loop filter bandwidth and, therefore, the PLL bandwidth. However this is not possible or adequate for all PLL applications.

The invention has been devised with the foregoing in mind.

SUMMARY

The invention provides a phase-locked loop (PLL) circuit which comprises a phase frequency detector, a charge pump associated with a loop capacitance, and a voltage controlled oscillator (VCO). The phase frequency detector receives a reference clock signal on a first input and a feedback signal from the voltage controlled oscillator on a second input. The charge pump receives control inputs from outputs of the phase frequency detector and then supplies charge and discharge current pulses of a limited duration to the loop capacitance. This avoids large voltage changes at the loop capacitor and, consequently, avoids excessive frequency excursions of the voltage controlled oscillator. Therefore, the noise performance of the phase-locked loop circuit is improved.

Preferably, the maximum duration of the charge and discharge current pulses is determined so as to reduce the output jitter of the voltage controlled oscillator.

The duration of the charge and discharge current pulses is temporarily not limited in an acquisition phase. This means that longer charge and discharge current pulses can be used to shorten the acquisition phase.

The control signals provided by the phase frequency detector to the charge pump are preferably UP and DOWN control signals. Pulse duration detection circuitry can be provided to detect the pulse duration of each of the UP and DOWN control signals, such that a disable signal is applied to the charge pump whenever the duration of an UP or DOWN control signal exceeds a predetermined value.

In a specific embodiment, the pulse duration detection circuitry includes an XOR-gate and an OR-gate. Both of the XOR-gate and the OR-gate have inputs connected to the phase frequency detector, such that both gates are operable to receive the UP and DOWN signals as input signals. The output of the XOR-gate is connected directly to the data input of a flip-flop circuit and the output of the OR-gate is connected to the clock input of the flip-flop circuit via a delay element. The output of the flip-flop circuit is then operable to output the disable signal when a pulsewidth of the signal output from the XOR-gate is greater than a time delay introduced to a clock signal output from the OR-gate by the delay element.

BRIEF DESCRIPTION OF THE DRAWINGS

Other features and advantages of the invention will become apparent from the below description of example embodiments and the accompanying drawings, wherein.

DETAILED DESCRIPTION OF PREFERRED EMBODIMENTS

Figure 1:
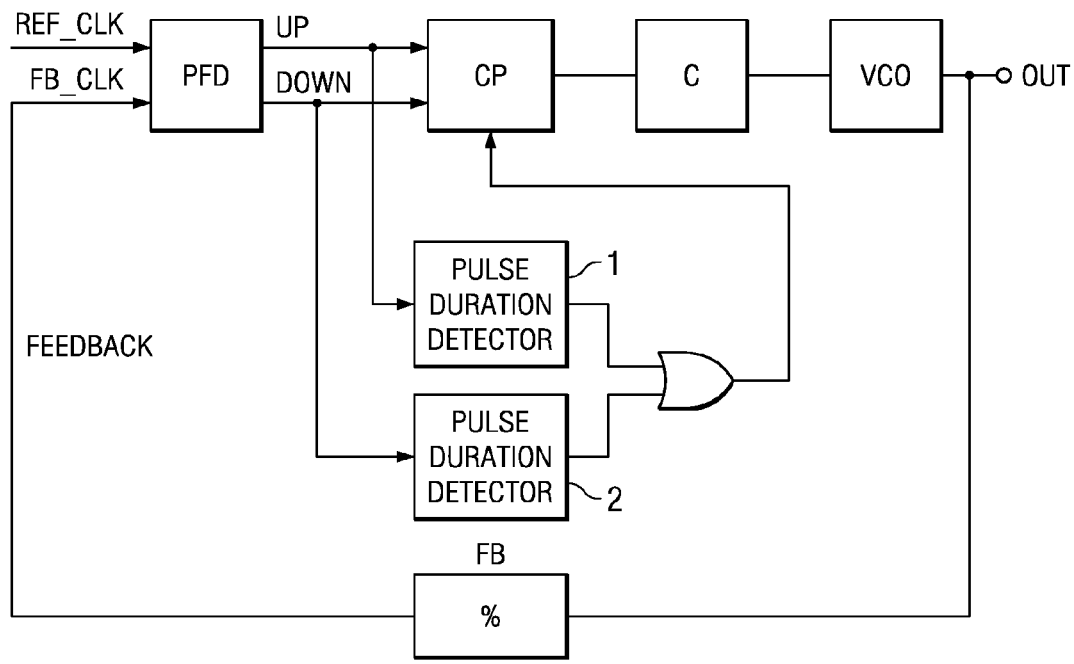
FIG. 1 is a schematic diagram of a first embodiment of a phase-locked loop circuit according to the principles of the invention.

FIG. 1 shows a phase-locked loop circuit including a phase frequency detector PFD having two inputs operable to respectively receive a a reference clock signal REF_CLK and a feedback clock signal FB_CLK. The phase frequency detector PFD has two outputs operable to output control signals: an UP signal and a DOWN signal. The two outputs to the phase frequency detector PFD are connected to inputs of a charge pump CP, one input being operable to receive the UP signal and the other input being operable to receive the DOWN signal. The charge pump CP also has a third input, which is a disablement input. The charge pump CP has one output connected to a loop capacitance C which is further connected to the control input of a voltage controlled oscillator VCO. The voltage controlled oscillator VCO has an output that is connected to the output OUT of the phase-locked loop circuit, and to provide the FB_CLK signal to one input of the phase frequency detector PFD via a feedback divider FB.

In addition to being connected to the charge pump CP, one output of the phase frequency detector PFD is connected to a first pulse duration detector 1 and the other output of the phase frequency detector is connected to a second pulse duration detector 2. The outputs of both pulse duration detectors form the inputs of an OR-gate. The output of the OR-gate is connected to the disablement input of the charge pump CP.

In operation, the phase frequency detector PFD compares the reference clock signal REF_CLK and feedback clock signal FB_CLK and outputs either an UP signal or a DOWN signal, depending on the phase difference between the compared clock signals. The UP signal or DOWN signal is input to the charge pump CP. If the signal is an UP signal, a current Iout is output from the charge pump CP to charge the loop capacitance C. If the signal is a DOWN signal, then the capacitor is discharged by the current Iout output from the charge pump CP.

Figure 3:
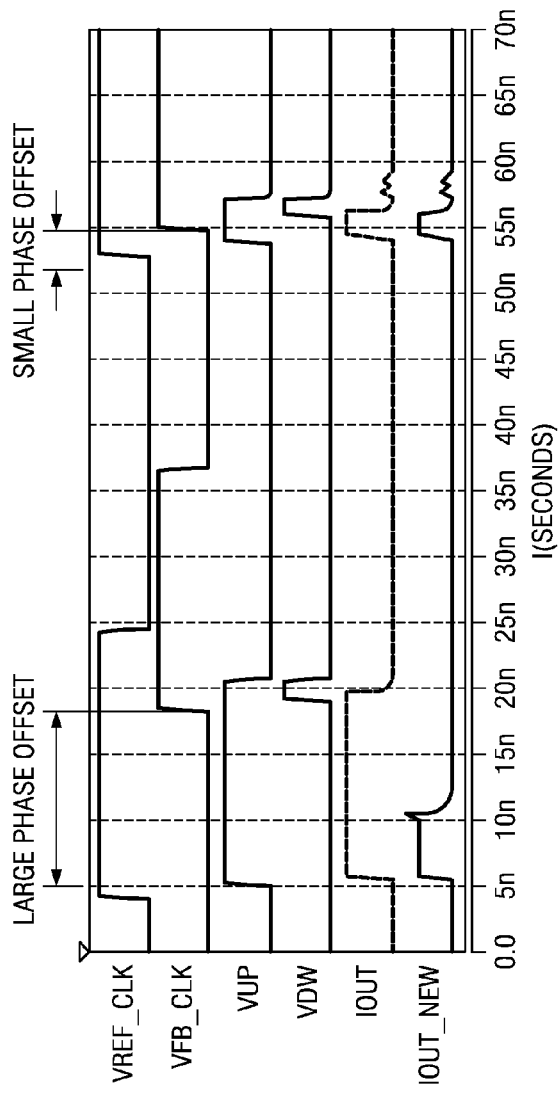
FIG. 3 is a graph of phase frequency detector and charge pump signals vs. time in a phased-locked loop circuit according to the invention, wherein a large and a small phase offset are applied between reference and feedback clock signals.

In a conventional PLL, if the phase offset between the reference clock signal REF_CLK and the feedback clock signal FB_CLK is large, which can be caused by a faulty or missing reference clock, then the pulsewidth of the UP signal or the DOWN signal will be long. This is illustrated in FIG. 3, wherein the UP signal is identified at VUP and the DOWN signal is identified at VDW. The voltage at the loop capacitance C will then change excessively, resulting in a large frequency excursion at the output of the voltage controlled oscillator VCO.

In the PLL circuit embodiment according to the invention, however, the UP signal and the DOWN signal output from the phase frequency detector PFD are also input to the pulse duration detectors 1 and 2, respectively. When either of the pulse duration detectors 1 and 2 detects a pulse duration above a predetermined limit value, it outputs a high signal, which opens the OR-gate. The OR-gate then outputs a disable signal that disables current Iout output from the charge pump CP. Therefore, the loop capacitance C is only charged by small amounts, which results in less disruption of the output phase and frequency. The phase-locked loop circuit can then be used in applications such as a jitter cleaner and can also be used in systems where there is an unstable reference clock.

Figure 2:
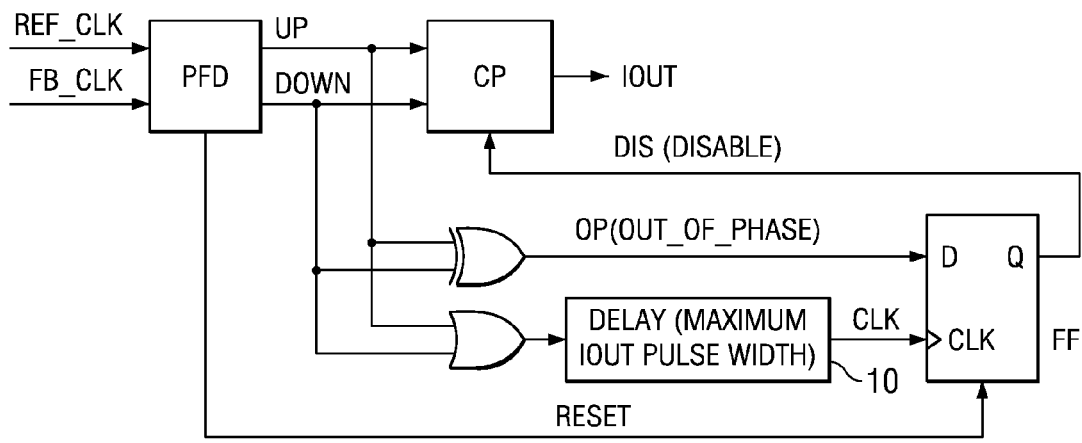
FIG. 2 is schematic diagram of a second embodiment of a phased-locked loop circuit according to the principles of the invention.

In a practical implementation, a narrow DOWN pulse is generated by the phase frequency detector to improve the performance of the phase-locked loop circuit. In this case, both of the UP and DOWN pulses momentarily occur at the same time. FIG. 2 shows an embodiment of the phase-locked loop circuit which ensures for each pulse that the detection of its duration starts when only one of the two pulses is present. It should be clear that the UP and DOWN pulses could be inverted, depending on the relative phases of REF_CLK and FB_CLK.

As in the first embodiment, the phase-locked loop circuit of FIG. 2 has a phase frequency detector PFD and a charge pump CP. The phase frequency detector PFD has two inputs, one of which is operable to receive the reference clock signal REF_CLK and the other of which is operable to receive the feedback clock signal FB_CLK. The phase frequency detector PFD has two outputs connected to the charge pump. One output is operable to output an UP signal and the other output is operable to output a DOWN signal. The charge pump CP is operable to output a current pulse Iout, which is used to charge or discharge a loop capacitance to a control voltage for a voltage controlled oscillator (VCO). The charge pump CP also has a disablement input, as in the first embodiment. The common components of the phase-locked loop circuit in the second embodiment may be identical to those in the first embodiment; so, for simplicity of illustration, the loop capacitance C, voltage controlled oscillator VCO and feedback divider FB are not repeated in FIG. 2.

The UP and DOWN outputs of the phase frequency detector PFD are both connected in parallel to the inputs of two logic gates. One of the logic gates is an OR-gate and the other is an XOR-gate. The output of the XOR-gate is connected directly to the input of a set input of a flip-flop circuit FF. The flip-flop FF has a set or data input D, a clock input CLK, a reset input RESET, and an output Q. The output of the OR-gate is connected to an input of a delay element 10 and the output of the delay element 10 is connected to the clock input CLK of the flip-flop circuit FF. The delay of the delay element 10 is determined to correspond to the maximum permissible duration of the UP and DOWN pulses. In addition to the two outputs operable to output UP and DOWN signals, the phase frequency detector PFD has a third output, which is connected to the reset input RESET of the flip-flop FF. The output Q of the flip-flop FF is connected to the disablement input of the charge pump CP.

In operation of the second embodiment (FIG. 2), as in the first embodiment (FIG. 1), the reference clock pulse REF_CLK and a feedback clock pulse FB_CLK are input to the phase frequency detector PFD. The phase frequency detector PFD then outputs an UP signal or a DOWN signal depending on the phase relationship between the feedback clock signal FB_CLK and the reference clock signal REF_CLK. The signal output from the phase frequency detector PFD is input to the charge pump CP. The charge pump CP then outputs a current signal Iout, which is dependent on whether an UP signal or a DOWN signal is received at its input. In the case of an UP signal, Iout is positive; and, in the case of a DOWN signal, Iout is negative. Iout charges or discharges a loop capacitance (see FIG. 1). As mentioned above, a narrow DOWN pulse is applied at regular intervals to the charge pump CP to improve the performance of the PLL circuit, so that a narrow DOWN pulse and an UP pulse are momentarily present at the same time.

As well as being input to the charge pump CP, for the example circuit shown in FIG. 2, the UP and DOWN signals are both input to the XOR-gate and the OR-gate, so that the XOR-gate and OR-gate each receives both an UP signal and a DOWN signal. The output of the XOR-gate remains low as long as both of the UP signal and the DOWN signal are high, but goes high when only one signal is present; whereas, the output of the OR-gate is high when either the UP signal, the DOWN signal or both are high. When the OR-gate outputs a high signal, a time delay is then introduced to the clock signal output from the OR-gate by the delay element 10. The delay element 10 thus applies to the clock input CLK of the flip-flop FF a signal delayed with respect to an output from the XOR-gate which is applied to the set input D of the flip-flop FF. Thus, there will only be a high signal at the output Q of the flip-flop FF when a high signal is received at the CLK input and the signal at the D input is high. In other words, the flip-flop FF will only output a disable signal from the output Q when the pulse output from the XOR-gate is long enough so that it is still at the D input of the flip-flop FF when a delayed signal arrives at the CLK input via the OR-gate and delay 10.

Configured as such, the charge pump CP is disabled whenever the phase offset between the UP and DOWN signals output from the phase frequency detector PFD is greater than the propagation delay time of the CLK signal path. The propagation delay time of the CLK signal path defines the maximum permitted current pulsewidth of the charge pump CP. The flip-flop FF is reset when the phase frequency detector PFD generates a reset signal RESET by the lagging input clock of the phase frequency detector PFD. After the reset, the cycle starts again.

In FIG. 3, the behaviors of the phase frequency detector PFD and charge pump CP signals are illustrated where there is a large phase offset between the REF_CLK and FB_CLK signals input to the phase frequency detector PFD, and also when there is a small phase offset between the REF_CLK and FB_CLK signals. The signal Iout shows the current pulse if the phase-locked loop circuit does not have a disablement circuit to disable the charge pump CP. The signal Iout_NEW represents the current pulse output from the charge pump with a disablement circuit. It can be seen that the current pulsewidth of the signal Iout can get much larger than that of the signal Iout_NEW. This is because the disable signal disables the charge pump when the phase offset between the UP and DOWN signals becomes too large.

Figure 4:
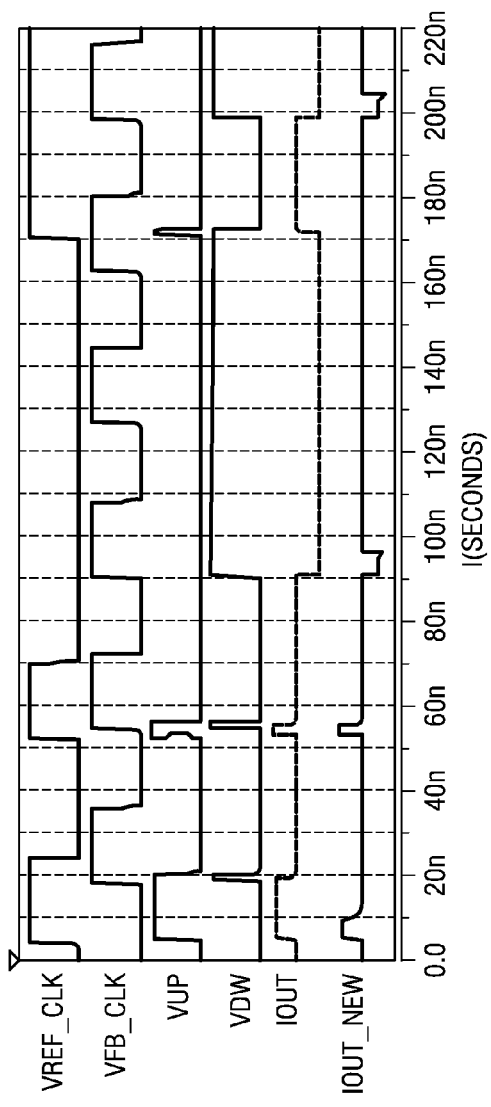
FIG. 4 is a graph of phase frequency detector and charge pump signals vs. time in a phased-locked loop circuit according to the invention, wherein clock signals are missing from a reference clock.

FIG. 4 shows the behavior of the phase-locked loop circuit of FIG. 1 or 2 when there are pulses missing from the reference clock REF_CLK. It can be seen that, during the time when the signal from the reference clock REF_CLK is missing, the current Iout output from the charge pump CP is a noisy signal (shown by the signal Iout) with irregular and long pulses, for the case when there is no disabling circuit in the PLL. When the charge pump disabling circuit is introduced into the PLL, the pulses of the current signal Iout_NEW output from the charge pump CP are much shorter and more regular. Therefore the control signal used to control the VCO will be much more stable and the PLL will not exhibit output jitter caused by irregular or missing reference clock pulses.

In the range when the phase offset is less than the propagation delay time of the CLK signal path, the phase-locked loop circuits shown in FIGS. 1 and 2 behave like conventional phase-locked loop circuits. Beyond that range, the phase-locked loop circuits exhibit the behavior of a phase-locked loop with a much lower bandwidth than a conventional phase-locked loop. For small phase offsets, the phase-locked loop remains in a lock state with a "high" loop bandwidth. For large offsets (caused by high input jitter or a missing reference clock), the charge pump current is disabled. The phase-locked loop stays in a "hold" mode, which will result in less disruption of the output phase and frequency. This behavior is suitable for applications like jitter cleaners, fractional-N PLLs or systems with an unstable reference clock.

In order to reduce wait time for the PLL to lock at start-up, the PLL is preferably implemented to switch the described charge pump disabling circuit off during initial PLL acquisition (that is, until the PLL is locked). This enables the UP or DOWN pulses to the charge pump to be long, without disabling the charge pump CP and increasing the lock time (or acquisition time) during start-up due to reduction in the "virtual" PLL bandwidth due to charge pump disabling.

Although the invention has been described with reference to specific example embodiments, those skilled in the art to which the invention relates will appreciate that there are other modifications and implementations that may be made within the scope of the claimed invention.

What is claimed is:

1. A phase-locked loop (PLL), comprising:
    a phase frequency detector (PFD) that receives a reference signal, wherein the PFD provides a first control signal and a second control signal;
    a charge pump that is coupled to the PFD so as to receive the first and second control signals;
    a control circuit that is coupled to the PFD so as to receive the first and second control signals and that is coupled to the charge pump so as to disable the charge pump if the duration of a pulse from at least one of the first and second control signals exceeds a predetermined limit;
    a loop filter that is coupled to the charge pump; and
    a voltage controlled oscillator that between the loop filter and the PFD so as to provide a feedback signal to the PFD.

2. The PLL of claim 1, wherein the control circuit further comprises:
    a first pulse duration detection circuitry that is coupled to the PFD so as to receive the first control signal;
    a second pulse duration circuit that is coupled to the PFD so as to receive the second control signal; and
    an OR-gate that is coupled to each of the first and second pulse duration detection circuits and to the charge pump so as to disable the charge pump if the duration of the pulse from at least one of the first and second control signals exceeds the predetermined limit.

3. The PLL of claim 1, wherein the control circuit further comprises:
    an OR-gate that is coupled to the PFD so as to receive each of the first and second control signals,
    an XOR-gate that is coupled to the PFD so as to receive each of the first and second control signals;
    a delay element that is coupled to the OR-gate; and
    a flip-flop that is coupled to each of the XOR-gate and the delay element, wherein the flip-flop is coupled to the charge pump so as to disable the charge pump if the duration of the pulse from at least one of the first and second control signals exceeds the predetermined limit.

4. The PLL of claim 3, wherein the flip-flop further comprises a D flip-flop with its D input terminal coupled to the XOR-gate and its clock input terminal coupled to the delay element.

5. A method comprising:
    generating a first control signal and a second control signal based at least in part on a reference signal and a feedback signal;
    controlling the operation of a charge pump with the first and second control signals;
    measuring whether the duration of a pulse from at least one of the first and second control signals exceeds a predetermined limit;
    if the duration of the pulse from at least one of the first and second control signals exceeds the predetermined limit, generating a disable signal that disables the charge pump;
    filtering an output signal from the charge pump to generate a voltage; and
    generating the feedback signal based at least in part on the voltage.

6. The method of claim 5, wherein the step of measuring whether the duration of the pulse from at least one of the first and second control signals exceeds the predetermined limit further comprises:
    measuring whether the duration of the pulse from the first control signal exceeds the predetermined limit;
    generating a first pulse duration signal based at least in part on the measurement of the duration of the pulse from the first control signal exceeds the predetermined limit;
    measuring whether the duration of the pulse from the second control signal exceeds the predetermined limit; and
    generating a second pulse duration signal based at least in part on the measurement of the duration of the pulse from the second control signal exceeds the predetermined limit.

7. The method of claim 6, wherein the step of generating a disable signal that disables the charge pump further comprise ORing the first and second pulse durations signals to generate the disable signal.

8. The method of claim 5, wherein the step of measuring whether the duration of the pulse from at least one of the first and second control signals exceeds the predetermined limit further comprises:
    XORing the first and second control signals to generate a first pulse duration signal;
    ORing the first and second control signals to generate a second pulse duration signal; and
    delaying the second pulse duration signal.

9. The method of claim 8, wherein the step of generating the disable signal that disables the charge pump further comprise:
    receiving the first pulse duration signal at the D input terminal of D flip-flop;
    receiving the second pulse duration signal at the clock input terminal of the D flip-flop; and
    generating the disable signal by the D flip-flop.

* * * * *